United States Patent [19]
Singh

[11] Patent Number: 6,054,893
[45] Date of Patent: Apr. 25, 2000

[54] LOW CURRENT DIFFERENTIAL FUSE CIRCUIT

[75] Inventor: Raminder Jit Singh, Singapore, Singapore

[73] Assignee: Institute of Microelectronics, Singapore, Singapore

[21] Appl. No.: 08/884,015

[22] Filed: Jun. 27, 1997

[30] Foreign Application Priority Data

Apr. 10, 1997 [SG] Singapore .............................. 9701110

[51] Int. Cl.[7] .......................... H01H 37/76; H01H 85/00
[52] U.S. Cl. .......................... 327/525; 365/96; 365/225.7
[58] Field of Search .............................. 327/525; 365/96, 365/225.7

[56] References Cited

U.S. PATENT DOCUMENTS

| | | | |
|---|---|---|---|
| 4,613,959 | 9/1986 | Jiang | 365/200 |
| 4,686,384 | 8/1987 | Harvey et al. | 365/96 |
| 5,428,311 | 6/1995 | McClure | 327/525 |
| 5,566,107 | 10/1996 | Gilliam | 327/525 |

*Primary Examiner*—Kenneth B. Wells
*Assistant Examiner*—Quan Tra
*Attorney, Agent, or Firm*—Proskauer Rose LLP

[57] ABSTRACT

A low current differential fuse circuit for adjusting the operating characteristics of semiconductor circuits. A switching circuit is connected between a first and a second fuse. The first and second fuses are respectively connected to a supply potential (e.g., 5.0 volts) and a reference potential (e.g., 0.0 volts). Additionally, each fuse is connected to a circuit for blowing the fuse. The switching circuit is also connected to a bias circuit that biases the switching components (e.g., a PMOS transistor and an NMOS transistor) to ensure that the switching circuit correctly switches in response to a selected fuse (e.g., either the first fuse or the second fuse) being blown (e.g., opened). An inverter circuit may also be provided between a switching node and an output node to provide a desired output potential.

22 Claims, 3 Drawing Sheets

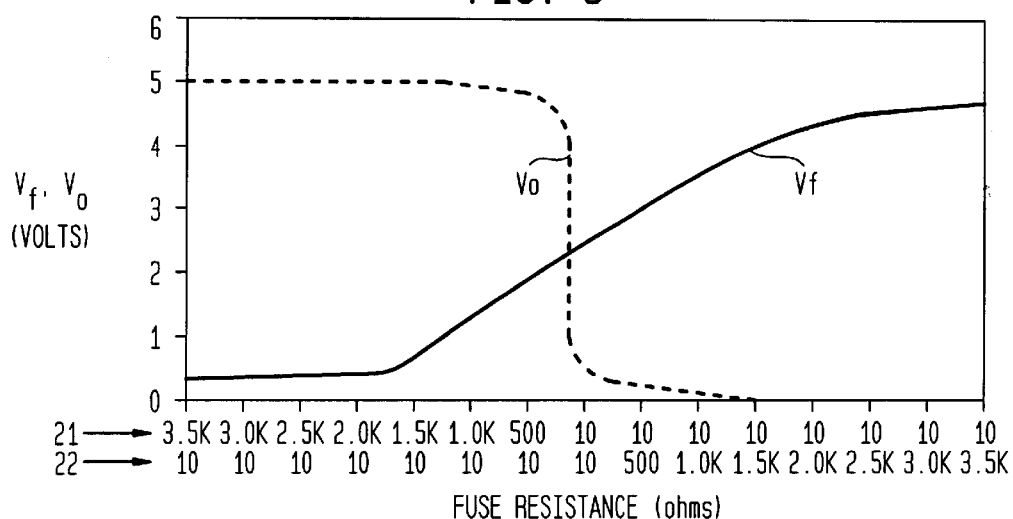
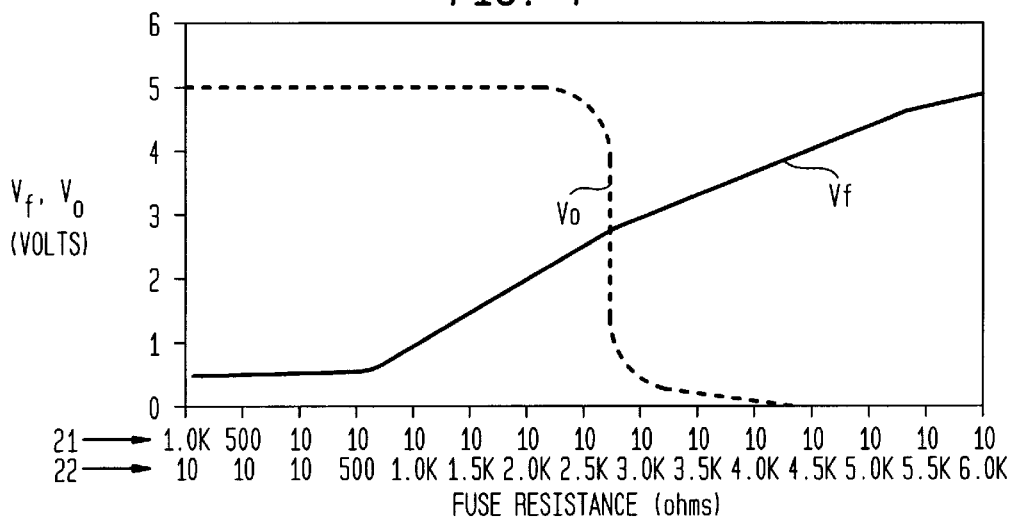
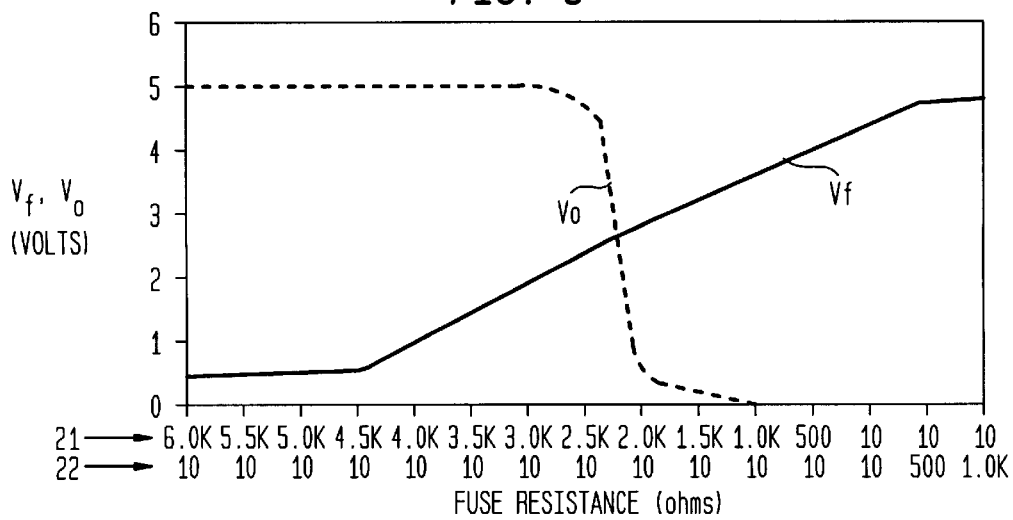

LOW CURRENT DIFFERENTIAL FUSE CIRCUIT

FIELD OF THE INVENTION

This invention generally relates to electronic circuits and specifically relates to a low current differential fuse circuit.

BACKGROUND OF THE INVENTION

Integrated circuits often require components having operating characteristics (e.g., resistance, capacitance, etc.) fabricated to a high degree of precision. For instance, the accuracy of a digital-to-analog (D/A) converter using binary weighted current sources depends on the matching accuracy of the transistors. Similarly, the accuracy of a charge redistribution analog-to-digital (A/D) convertor or D/A convertor depends on the matching accuracy of the capacitors. The component's characteristics, such as a capacitor's capacitance, used in the D/A or A/D converter must be fabricated to establish a precise relationship between the components to maintain correct weighting of the individual bits of the converter.

Variations in the operating characteristics of the components will adversely affect the ability of the converter to correctly convert a given input such as a digital word for a D/A converter or an analog voltage level for an A/D converter. In semiconductor circuit fabrication, processing variations often prevent components from having precisely fabricated operating characteristics. This problem is further compounded in a device such as in an A/D or D/A converter where the operating characteristics of a given component, in relation to the operating characteristics of other components, are critical. The greater the resolution of a given converter (e.g., the more bits that are involved in the conversion process), the greater the number of components that must be precisely matched. Experimentally, it has been proven that transistors, resistors and capacitors can be fabricated for a ratio matching accuracy (e.g., the relative characteristics of all the components required for a given application, such as all the resistors used in the conversion process for an A/D converter) of up to 10-bits (either input bits for a D/A converter or output bits for an A/D converter) with good yields. Yet, in sound processing applications for example, a conversion resolution of 20-bits or more is commonly required.

To fabricate reliably a D/A converter that can accurately convert a given input of greater than 10-bits, or fabricate reliably an A/D converter that can accurately convert a given input to an output of greater than 10-bits, requires a calibration process such as laser trimming to calibrate precisely the operating characteristics of components. Laser trimming is a calibration process where individual components of an integrated circuit are cut using a laser to alter specific physical characteristics (e.g., surface area) of the components. Reducing the surface area of a given component, also affects the operating characteristics of that component. By precisely measuring the operating characteristics of the component during the laser trimming process, the operating characteristics of the component can be precisely calibrated. However, laser trimming is expensive and time consuming in that it requires extra processing steps to complete the fabrication of the component. Additionally, laser trimming requires a special test setup and must be performed prior to packaging the integrated circuit. This introduces another problem in that some component values change after packaging due to factors such as stray capacitance of the packaging material or stress during the packaging process. For such cases, laser trimming cannot be used. The prior art teaches using an on-chip programmable memory to solve the above problems. The on-chip programmable memory may consist of fuse, EPROM or EEPROM circuits.

In practice, an integrated circuit is fabricated with additional components ("calibrating components") having an assortment of operating characteristics. During the calibration of the integrated circuit, either the fuses or the PROM circuits are used to selectively connect the calibrating components to the component that requires the calibration (the "calibrated component") until the operating characteristics of the combined components are precisely adjusted. For example, a capacitor (the calibrated component) may have several additional capacitors (the calibrating components) added in parallel until the precise required capacitance is obtained.

The problem with using EPROMs and EEPROMs to calibrate the operating characteristics of components is that the fabrication of EPROM and EEPROM memory circuits requires additional processing steps. A fuse can be fabricated during standard CMOS processing and is therefore less expensive to use for calibrating components than EPROM and EEPROM memory circuits.

One prior art method of calibrating a component uses a single fuse between the calibrated component and each individual calibrating component. Initially, the fuse operates as a short circuit between the calibrated component and the calibrating components. During the calibration of the component, the fuses are selectively opened (blown out) by passing a large current through the fuse. The components that are attached to the blown out fuse are physically disconnected from the calibrated component and thus do not affect the operating characteristics of the calibrated component.

A problem with using fuses to calibrate components is that each fuse requires a separate bond pad (input terminal) to enable the selective burning of each fuse. A large number of fuses may be required on one chip to enable a proper calibration of the critical components and it may not be possible to have a separate input terminal to selectively blow each fuse. To solve this problem, an on-chip decoder may be used to selectively address each fuse. However, the use of a decoder limits the current that can be used to blow a fuse. As a result of this limited current, a fuse may only be partially blown. In the single fuse method of calibrating a component (as discussed above), the partially blown fuse will have some unpredictable resistance which will alter the effect that an added component (e.g., the calibrating component) will have on the calibrated component. This results in an indeterminable output which destroys the utility of a calibrating circuit.

Another prior art method of calibrating components, which overcomes the problems of the single fuse method discussed above, uses a differential fuse circuit. Unlike the single fuse circuit, the differential fuse circuit has two fuses per calibrating component and the relative difference in the resistance value of the two fuses determines whether the calibrating component is used or not. In operation, only one of the two fuses is blown and only a relatively small difference in resistance between the blown and unblown fuse (remembering that even an unblown fuse has some measurable resistance) is required to set the output of the differential fuse circuit either to a "low" or a "high" potential. The potential at the output of the differential fuse circuit determines whether the calibrating component is used or not. Therefore, even if a fuse is only partially blown, the resistance of the partially blown fuse does not alter the effect of the calibrating component. The differential fuse circuit solves the problem that the single fuse circuit has with partially blown fuses but introduces another problem in that the differential fuse circuit of the prior art consumes from 5 to 10 μA of current.

A differential fuse circuit is disclosed in U.S. Pat. No. 5,353,028 to Michiel de Wit ("the '028 patent"). The contents of the '028 patent are incorporated herein by reference.

FIG. 1 shows a differential fuse circuit as disclosed in the '028 patent. This differential fuse circuit comprises a bias circuit 20, a fuse circuit 10 and an invertor 13. The fuse circuit 10 comprises a first leg that is connect to a supply potential $V_{SUPPLY}$ through a first fuse 11, and a second leg that is connect to a supply potential $V_{SUPPLY}$ through a second fuse 12. The first and second leg are configured such that a current in a lower portion of the first leg will induce a current in a lower portion of the second leg. This is called a "current mirror" circuit since the current in the lower portion of the second leg "mirrors" the current in the lower portion of the first leg. Conversely, a current in the lower portion of the second leg does not induce a current in the lower portion of the first leg.

In operation, if the resistance of the second fuse 12 is made greater than the resistance of the first fuse 11 (e.g., the second fuse 12 is blown), there is essentially no current $I_2$ in the upper portion of the second leg. The current $I_1$ in the first leg is not affected by the second fuse 12 being blown and the current in the lower portion of the first leg induces a current in the lower portion of the second leg (due to the current mirror described above). Therefore, a node $V_f$, which is connected between the upper and lower portion of the second leg, is essentially at the same potential as a reference supply $V_{REF}$ (e.g., a low potential) and the potential at an output node $V_o$, which is connected to the node $V_f$ through the inverter 13, is at a high potential.

In this case, the current I2 through the second fuse 12 is small for a large resistance of the second fuse 12 (e.g., a blown fuse). The current $I_1$ through the first fuse 11 is independent of the resistance of the blown second fuse 12 and depends on the bias current from the bias circuit 20. The current $I_1$ is typically in the range of 5 to 10 μA.

To set the potential at the output node $V_o$ low, the first fuse 11 is blown and thereby, there is essentially no current $I_1$. Since essentially no current flows in the lower portion of the first leg of the fuse circuit 10, essentially no current flows in the lower portion of the second leg of the fuse circuit 10 (due to the current mirror effect). In this case, the current $I_2$ (since the second fuse 12 is unblown) causes the node $V_f$ to be essentially at the same potential as $V_{SUPPLY}$ (e.g., high). Therefore, the potential at the output node $V_o$ is low.

When the first fuse 11 is blown and the second fuse 12 is intact (e.g., when the potential at the output node $V_o$ is low), current's $I_1$ and $I_2$ are small as long as the resistance of the first fuse 11 (the blown fuse) is large (e.g., greater than 2 MΩ). When the potential at the output node $V_o$ is high (e.g., when the first fuse 11 is unblown and the second fuse 12 is blown), the current $I_2$ is low (due to the high resistance of the blown second fuse 12). The current I1 (typically in the range of 5 to 10 μA, as discussed above) is independent of the resistance of the blown second fuse 12 and depends on the bias circuit 20.

The differential fuse circuit of the prior art has several drawbacks. For example, using the prior art differential fuse circuit, an integrated circuit having N fuse circuits, with half the fuse circuits programmed "high" (e.g., the potential at the output node $V_o$ is high), consumes approximately ($I_1 \times N/2$) amps (not including the bias current or the current consumed by the rest of the integrated circuit). For the case when N is large, the fuse circuits will consume a large amount of current which may not be acceptable for many low current integrated circuit applications.

To solve the above problems, a new low current differential fuse circuit is hereby disclosed.

Therefore, it is an object of the present invention to provide a method of forming a low current differential fuse circuit which consumes less than 1 μA of current (aside from bias current) when the potential at the output node $V_o$ is high or low (e.g., when either the first or second fuse is blown).

Another object of this invention is to provide an improved differential fuse circuit (e.g., a low current differential fuse circuit) which consumes less than 1 μA.

A further object of this invention is to provide a circuit and a method of forming it that can be utilized to appropriately change the value of components without requiring additional processing steps.

A still further object of this invention is to provide a circuit configuration and a method of forming that circuit configuration, which can compensate for characteristic variations of integrated circuit components without requiring external means such as laser trimming.

SUMMARY OF THE INVENTION

These and other objects of the present invention are achieved by a low current differential fuse circuit of the present invention. A preferred embodiment of the present invention has a first fuse and a second fuse. The first fuse is coupled to a supply potential. The second fuse is coupled to a reference potential through an NMOS transistor. The fuses are coupled together through a switching circuit. A first circuit is coupled to the first fuse for selectively blowing the first fuse. A second circuit is coupled to the second fuse for selectively blowing the second fuse. One of the first or second fuses is selectively blown by its respective fuse blowing circuit. The switching circuit switches the potential of a switch ing node depending on the relative state of the first fuse to the second fuse (e.g., depending on which fuse is blown). The switching node is switched by the switching circuit to the potential connected to the first fuse (e.g., a supply or high potential), if the second fuse is blown. The switching node is switched by the switching circuit to the potential connected to the second fuse (e.g., a reference or low potential), if the first fuse is blown. A bias circuit is preferably connected to the switching circuit to ensure that the switching circuit correctly switches in response to a selectively blown fuse. Further, an invertor is preferably connected to the switching node to achieve a desired output potential (e.g., either a "high" or "low" potential) at an output node coupled to the inverter.

In operation, a low current differential fuse circuit configured according to the present invention consumes less than 1 μA of current (not including the bias current) when the potential at the output node $V_o$ is either high or low (e.g., when either the first or second fuse is blown). This is preferably accomplished by configuring a switching circuit comprising a PMOS transistor with its drain coupled to a drain of an NMOS transistor. As a result of using the switching circuit of the present invention as opposed to the prior art current mirror circuit (shown in FIG. 1 and discussed above), the current consumption of the fuse circuit can be reduced from the 5 to 10 μA level of the prior art, to less than 1 μA by the present invention.

The low current differential fuse circuit of the present invention consumes less than ⅕ the current of the prior art differential fuse circuit. This low current consumption renders the circuit of the present invention more practical for low current circuit applications. Yet, the circuit of the present invention is reliable for precisely calibrating the components of a circuit.

In a preferred embodiment of the present low current differential fuse circuit, a fuse blowing circuit (e.g., the fuse blowing circuit coupled to the second fuse) may share a component amongst a plurality of low current differential fuse circuits. Therefore in an application that requires a plurality of low current differential fuse circuits, less surface area is required than if a completely separate fuse blowing circuit is used. This sharing of components in the fuse blowing circuit saves surface area without having any adverse effects in the utility of the low current differential fuse circuit of the present invention.

BRIEF DESCRIPTION OF THE DRAWINGS

Following is a description of a preferred embodiment of the present invention, which when taken in connection with the following drawings, will illustrate the above noted features and advantages as well as further ones. It should be expressly understood that the drawings are included for illustrative purposes and do not represent the scope of the present invention.

FIG. 3 is a plot of the results of a SPICE simulation of the circuit shown in FIG. 2;

FIG. 4 is a plot of the results of a SPICE simulation of the circuit shown in FIG. 2, having a current offset between the fuse circuit and the bias circuit; and FIG. 5 is a plot of the results of a SPICE simulation of the circuit shown in FIG. 2, having a current offset between the fuse circuit and the bias circuit which is different from the current offset shown in FIG. 4.

DETAILED DESCRIPTION OF THE PREFERRED EMBODIMENT

Figure 1:
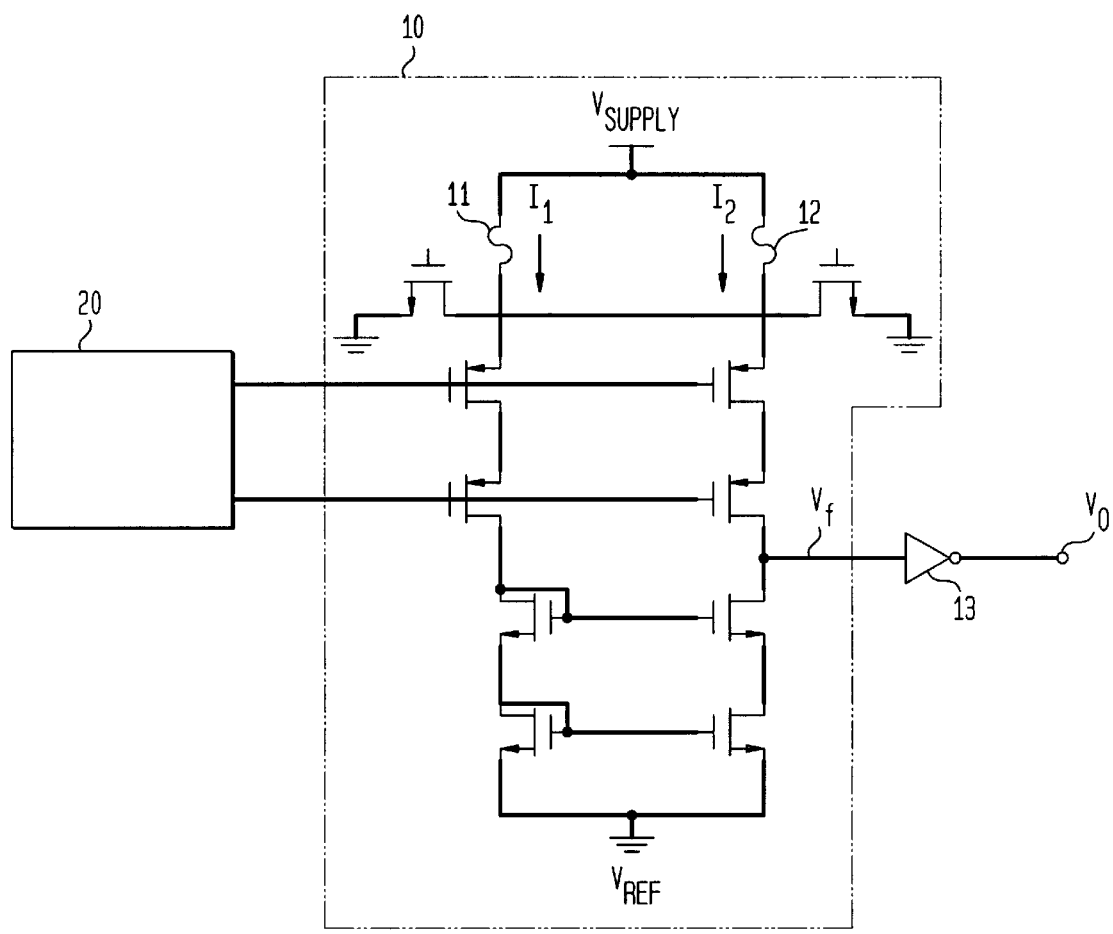
FIG. 1 is a schematic diagram of a prior art differential fuse circuit.
Figure 2:
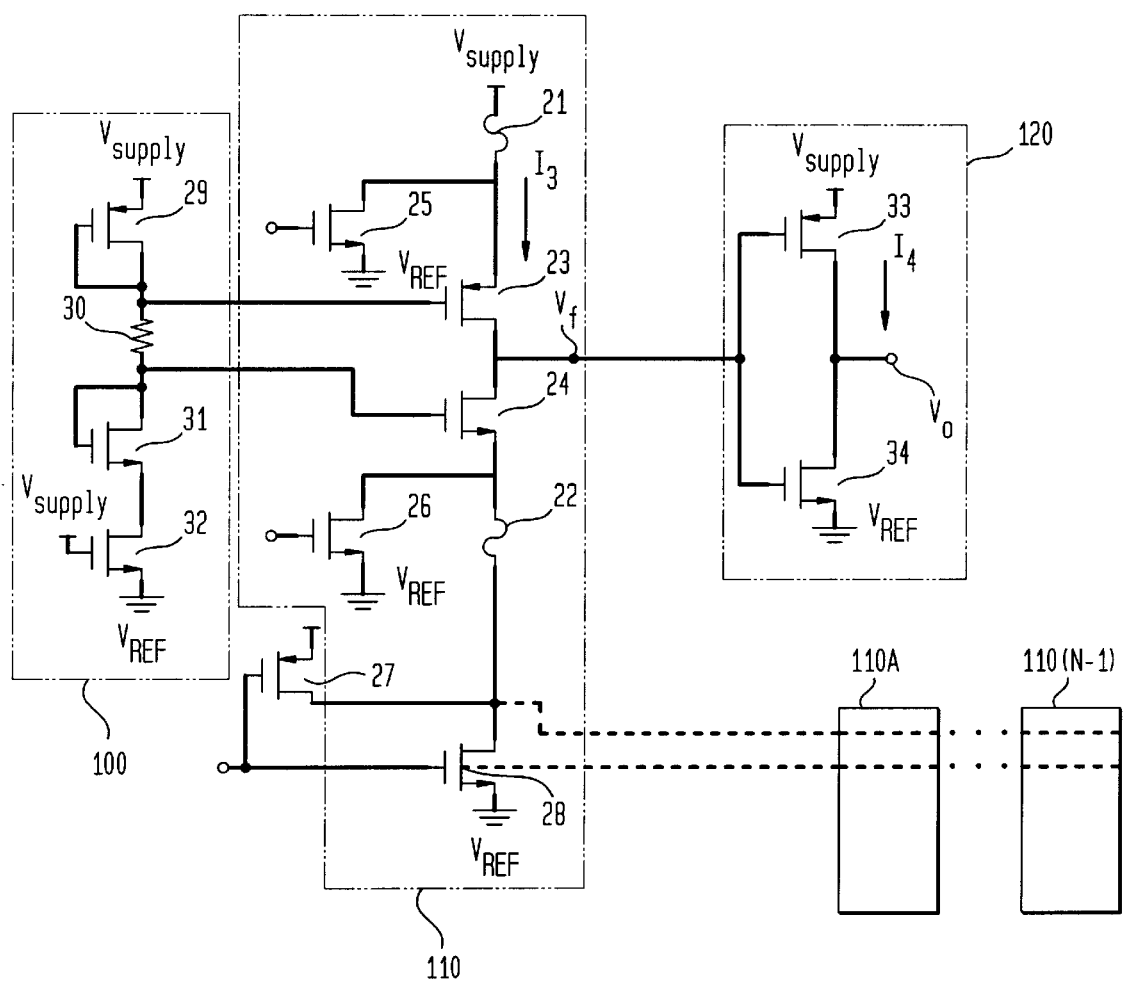
FIG. 2 is a schematic diagram of a low current differential fuse circuit, in accordance with a preferred embodiment of the present invention.

A circuit diagram of a preferred embodiment of a low current differential fuse circuit according to the present invention is shown in FIG. 2. As a result of this novel circuit, the fuse circuit of the present invention consumes less than ⅕ of the current (not including the bias current) of the prior art fuse circuit. Yet, the fuse circuit of the present invention can reliably and precisely calibrate the components of a circuit.

Further, in a preferred embodiment of the low current differential fuse circuit of the present invention, a portion of the circuitry used by the low current differential fuse circuit (e.g., a portion of a fuse blowing circuit) may be shared amongst a plurality of low current differential fuse circuits. This reduces the circuit area required by the plurality of low current differential fuse circuits, without any adverse effects in the utility of the low current differential fuse circuit of the present invention.

Hereinafter, any reference to a "fuse" is intended to encompass any fusible link including, but not limited to, a gate junction, a resistor, a metal fuse, a polysilicon fuse, or any other fusible link. Any reference to a "blown fuse," or any other such terms, is intended to encompass the process of altering the resistance of the fuse (a fusible link, etc.) such that the resultant resistance of the blown fuse is greater than the resistance of an unblown fuse.

As shown in FIG. 2, the low current differential fuse circuit of the present invention preferably comprises a bias circuit 100 connected to a fuse circuit 110. The output of the fuse circuit 110 is preferably connected to an inverter circuit 120. An output node $V_o$ is connected to an output of the inverter circuit 120. The state of the output node $V_o$ determines if a component (a "calibrating component," not shown) is used to calibrate another component (a "calibrated component," not shown).

Specifically, the fuse circuit 110, according to a preferred embodiment, comprises a first fuse 21, a second fuse 22, a first fuse blowing circuit, a second fuse blowing circuit and a switching circuit. The first fuse 21 is connected to a supply potential $V_{SUPPLY}$ and the switching circuit. The fuse may be a metal fuse or any other fuse or fusible link such as a resistor, gate junction, etc. (as discussed above). For a metal fuse, the potential of $V_{SUPPLY}$ is preferably in the range of 4.5 to 5.5 volts and is nominally 5.0 volts. The switching circuit preferably comprises a P-channel MOS transistor (a "PMOS transistor") and an N-channel MOS transistor (an "NMOS transistor"). The first fuse 21 is connected to a source of the PMOS switching transistor 23. A drain of the PMOS switching transistor 23 is connected to a drain of the NMOS switching transistor 24. A source of the NMOS switching transistor 24 is connected to the second fuse 22. The second fuse 22 is also connected to a reference potential $V_{REF}$ through an NMOS transistor 28. For a metal fuse, the potential of $V_{REF}$ is preferably in the range of –0.5 to +0.5 volts and is nominally 0.0 volts.

The first fuse 21 is also connected to a first fuse blowing circuit to enable the first fuse 21 to be selectively blown (e.g., to increase the resistance of the blown fuse with respect to the resistance of the unblown fuse, as discussed above) during the calibration of the calibrated component. The circuit for blowing the first fuse 21 preferably comprises an NMOS transistor 25 with a drain connected to the first fuse 21 and a source connected to the reference potential $V_{REF}$. The NMOS transistor 25 can be selectively enabled to blow the first fuse 21 by applying a "high" potential (e.g., 5 volts) to a gate of the NMOS transistor 25.

The width to length ratio, or aspect ratio, of the NMOS transistor 25 is preferably large enough to allow 30 to 50 mA of current through the first fuse 21 for a $V_{SUPPLY}$ potential of 4.5 to 5.5 volts. This current is sufficient to blow the preferred metal fuse.

The second fuse 22 is connected to a second fuse blowing circuit preferably comprising an NMOS transistor 26, the NMOS transistor 28, and a PMOS transistor 27. The PMOS transistor 27 may be part of the fuse circuit 110, or it may be shared amongst a plurality of fuse circuits 110, 110A, 110B, etc. (as discussed below). A drain of the NMOS transistor 26 is connected to a side of the second fuse 22. Another side of the second fuse 22 is connected to a drain of the PMOS transistor 27 and a drain of the NMOS transistor 28. The source of the PMOS transistor 27 is connected to the supply potential $V_{SUPPLY}$.

To blow the second fuse 22, the NMOS transistor 26 and the PMOS transistor 27 are turned "on" and the NMOS transistor 28 is turned "off" by applying a high potential (e.g., 5.0 volts) to a gate of the NMOS transistor 26 and applying a low potential (e.g., 0.0 volts) to the gate of the PMOS transistor 27 and the NMOS transistor 28. The aspect ratio of the NMOS transistor 26 and the PMOS transistor 27 is preferably large enough to allow 30 to 50 mA of current through the second fuse 22 which is sufficient to blow the preferred metal fuse.

Since the transistor 27 is a PMOS transistor, its aspect ratio is typically three times that of an NMOS transistor for the same current carrying capacity. Therefore, the PMOS transistor 27 will occupy a relatively large silicon area. To reduce the fuse circuit area used by an integrated circuit that requires a plurality of fuse circuits, the preferred embodiment of the present invention shares the PMOS transistor 27 amongst the plurality of fuse circuits, including fuse circuits 110 and 110A through 110(N-1). This greatly reduces the surface area occupied by a plurality of low current differential fuse circuits in a given application.

The current through the PMOS switching transistor 23 and the NMOS switching transistor 24 is set by the bias circuit 100. The bias circuit 100 preferably comprises a PMOS transistor 29 that has a source connected to the supply potential $V_{SUPPLY}$ and has a gate and drain connected together. The gate and drain of the PMOS transistor 29 are connected to a gate of the PMOS switching transistor 23 and a side of a resistor 30. Another side of the resistor 30 is connected to a drain and gate of an NMOS transistor 31 and a gate of the NMOS switching transistor 24. A source of the NMOS transistor 31 is connected to a drain of an NMOS transistor 32. The NMOS transistor 32 has a gate connected to the supply potential $V_{SUPPLY}$ and a source connected to $V_{REF}$.

To reduce the effect of the resistance of the NMOS transistor 28 on the NMOS switching transistor 24, the aspect ratio of the NMOS transistor 28 is preferably made large so that its "on resistance" is very small (typically less than 500 Ω). To maintain the same bias conditions for the NMOS switching transistor 24 and the NMOS transistor 31, the aspect ratio of the NMOS transistor 32 is preferably kept the same as that of the NMOS transistor 28.

A switching node $V_f$ is connected between the PMOS switching transistor 23 and the NMOS switching transistor 24. The switching node $V_f$ is also connected to the invertor 120. The inverter 120, preferably comprising a PMOS transistor 33 and an NMOS transistor 34, is configured to invert the potential at the switching node $V_f$ and obtain a desired potential (e.g., either 0.0 or 5.0 volts) at the output node $V_o$.

In operation, if the first fuse 21 is blown (e.g., the resistance of the first fuse 21 is higher than the resistance of the second fuse 22), the gate-to-source potential of the PMOS switching transistor 23 will decrease which increases the resistance of the PMOS switching transistor 23. As a result thereof, the potential of the switching node $V_f$ will go low and the potential at the output node $V_o$ will go high (e.g., 5.0 volts). This for instance, may connect the calibrating component to the calibrated component so that the calibrating component will affect the operating characteristics of the calibrated component. Similarly, if the second fuse 22 is blown (e.g., the resistance of the second fuse 22 is greater than the resistance of the first fuse 21), the gate-to-source potential of the NMOS switching transistor 24 will decrease which increases the resistance of the NMOS switching transistor 24, with the result that the potential of the switching node $V_f$ will go high and the potential of the output node $V_o$ will go low (e.g., 0.0 volts). This for instance, may disconnect the calibrating component from the calibrated component so that the calibrating component will not affect the operating characteristics of the calibrated component.

FIG. 3 shows the simulated transfer curves of the preferred circuit shown in FIG. 2 as a function of the potential at the switching node $V_f$ and the output node $V_o$, with respect to the resistances of the first fuse 21 and the second fuse 22. Table 1 tabulates the resultant current $I_3$ though the fuse circuit 110 and the resultant current $I_4$ through the inverter circuit 120, for the resistance and current values shown in FIG. 3. The higher resistance values set out in FIG. 3 and Table 1, are values that may be obtained if either the first fuse 21 or the second fuse 22 is not completely blown. The lower resistance value set out in FIG. 3 and Table 1 (e.g., 10 Ω), is the resistance of an unblown metal fuse.

As is apparent from FIG. 3, for a 10 Ω resistance of the second fuse 22 (e.g., the typical unblown fuse resistance for a metal fuse) and a 1 KΩ or higher resistance for the first fuse 21 (e.g., the blown fuse resistance), the voltage at the output node $V_o$ is 5.0 volts (e.g., at a high potential). For a 1 KΩ or higher resistance of the second fuse 22 (e.g., the blown fuse resistance), and a 10 Ω fuse resistance of the first fuse 21 (e.g., the typical unblown fuse resistance of a metal fuse), the voltage at the output node $V_o$ is 0.0 volts (e.g., at a low potential).

As shown in Table 1, for a 500 KΩ or higher resistance of the blown fuse (e.g., either the first fuse 21 or the second fuse 22), the fuse circuit of the present invention will consume less than 1 μA of current. If the fuse is blown completely (e.g., if either the first fuse 21 or the second fuse 22 has a 10 MΩ or higher resistance), there is virtually no current through the fuse circuit.

The simulation results shown in FIG. 3 and Table 1 are for the PMOS switching transistor 23 having a zero current offset with respect to the PMOS transistor 29, and the NMOS switching transistor 24 having a zero current offset with respect to the NMOS transistor 31.

TABLE 1

$I_3$, $V_F$, $V_O$ Vs Fuse Resistances

| Resistance (Ω) | | $I_3$ | $I_4$ | $V_f$ | $V_O$ |
|---|---|---|---|---|---|
| 21 | 22 | (μA) | (μA) | (V) | (V) |
| 10M | 10 | 0.0 | 0.0 | 0.0 | 5.0 |
| 500K | 10 | 0.6 | 0.0 | 0.0 | 5.0 |
| 100K | 10 | 2.2 | 0.0 | 0.1 | 5.0 |
| 2K | 10 | 9.5 | 0.0 | 0.4 | 5.0 |
| 1K | 10 | 9.8 | 2.7 | 1.2 | 5.0 |
| 500 | 10 | 9.9 | 19.0 | 1.8 | 4.7 |
| 10 | 10 | 10.0 | 41.9 | 2.5 | 0.9 |
| 10 | 500 | 9.9 | 22.0 | 3.0 | 0.3 |
| 10 | 1K | 9.8 | 8.2 | 3.4 | 0.1 |
| 10 | 2K | 9.5 | 0.0 | 3.5 | 0.0 |
| 10 | 100K | 2.7 | 0.0 | 4.9 | 0.0 |
| 10 | 500K | 0.8 | 0.0 | 5.0 | 0.0 |
| 10 | 10M | 0.0 | 0.0 | 5.0 | 0.0 |

In a real application, there is some current mismatch between transistors 23 and 29 and transistors 24 and 31. This current mismatch is due to several factors such as variations in the substrate material that the components are formed on, resistance of the leads between components (since the bias circuit 100 and the fuse circuit 110 can be located from 1 to 2 mm apart), variations in component operating characteristics, etc. The current mismatch can reliably be fabricated to be from 1–2 percent. In the case when there is a current mismatch, a larger difference between the blown and the unblown fuse resistances is required to set the output node $V_o$ to a known logic state (e.g., either a low or high potential).

One way to simulate the effect of the current offset of the switching transistors to the bias transistors is by changing the aspect ratio of the switching transistors 23 and 24 with respect to the bias resistors 29 and 31, respectively. For this purpose, two parameters, m1 and m2 are defined. Parameter m1 equals the aspect ratio of the PMOS switching transistor 23 divided by the aspect ratio of the PMOS transistor 29. Parameter m2 equals the aspect ratio of the NMOS switching transistor 24 divided by the aspect ratio of the NMOS transistor 31.

FIG. 4 shows that if the PMOS switching transistor 23 draws 5% less current than is drawn by the PMOS transistor 29 (m1=0.95), and the NMOS switching transistor 24 draws 5% more current than is drawn by the NMOS transistor 31 (m2=1.05) under respectively identical bias conditions, then a difference of 4.0 KΩ between the resistances of the blown fuse (the second fuse 22) and the unblown fuse (the first fuse 21) is required to set the output node $V_o$ to a low potential.

Similarly, FIG. 5 shows that if the PMOS switching transistor 23 draws 5% more current than is drawn by the PMOS transistor 29 (m1=1.05) and the NMOS switching transistor 24 draws 5% less current than is drawn by the NMOS transistor 31 (m2=0.95), under the same bias conditions, then a difference of 4.0 KΩ between the resistances of the blown first fuse 21 and the unblown second fuse 22 is required to set the output node $V_o$ to a high potential. Since a current mismatch between the switching transistors and the bias transistors can generally be maintained at less than 5% and a difference of more than 4.0 KΩ between the resistances of the blown and unblown fuses can readily be realized, the output node $V_o$ will always be at a known potential (either a low or high potential).

As an alternative to the above described preferred embodiment, the fuses 21 and 22 may also comprise polysilicon. The typical resistance of an unblown polysilicon fuse is 100 Ω and a preferred range for the $V_{SUPPLY}$ potential is between six and seven volts with a nominal voltage of 6.5 volts.

Conclusion

The low current differential fuse circuit disclosed in the present invention is a low cost alternative to using an EPROM memory, an EEPROM memory, or laser trimming, to calibrate components of a given circuit. The low current differential fuse circuit of the present invention can be implemented in a standard CMOS process without any additional processing steps and consumes less than 1 μA of current (other than bias current). This low current differential fuse circuit, as illustrated by the above preferred embodiments, consumes less than ⅕ of the current that is required by the prior art differential fuse circuit. This reduction in current consumption is a result of using the switching circuit of the present invention as opposed to the current mirror circuit that was known in the prior art. Therefore, the circuit of the present invention can be used in low current integrated circuits that require a high degree of precision, such as an A/D converter that has more than 10-bits of resolution.

Further, by preferably sharing the PMOS transistor 27, which is a portion of the second fuse blowing circuit, among a plurality of low current differential fuse circuits, the plurality of low current differential fuse circuits will occupy less surface area than if the fuse blowing circuits did not share components. Therefore, a plurality of low current differential fuse circuits, according to the preferred embodiment of the present invention, require less surface area and are more practical in applications where there is a minimum of free surface area that can be utilized by the plurality of fuse circuits.

While the invention has been described with reference to the preferred embodiments, it will be apparent to those skilled in the art that numerous variations can be made without departing from the spirit or scope of the invention which is defined by the appended claims. While the above preferred circuit has been discussed with reference to A/D and D/A converters, the present invention may be used in any circuit application where a high degree of precision is required in the operating characteristics of the components which comprise the circuit, such as in a signal conditioning application where offset and sensitivity variations of sensors must be compensated. The preferred embodiments were described above solely for illustrative purposes and were not intended to limit the scope of the appended claims.

I claim:

1. A low current differential fuse circuit having an output $V_f$, comprising:

a first fuse, having a first resistance coupled to receive a supply potential;

a first circuit coupled to said first fuse for blowing said first fuse;

a first transistor, having its source connected to said first fuse and to said first circuit and its gate configured to receive a bias potential;

a second fuse, having a second resistance coupled to receive a reference potential;

a second circuit coupled to said second fuse for blowing said second fuse; and a second transistor, having its source connected to said second fuse and to said second circuit and its gate configured to receive said bias potential;

wherein when said first fuse is fully or partially blown, said first resistance is higher than said second resistance, wherein when said second fuse is fully or partially blown, said second resistance is higher than said first resistance, and wherein said output $V_f$ being relatively low when said first resistance is higher than said second resistance and being relatively high when said second resistance is higher than said first resistance, such that the state of said output being independent of said bias potential.

2. The low current differential fuse circuit of claim 1, further comprising a bias circuit for generating said bias potential, wherein said bias circuit is coupled to said first and second transistors.

3. The low current differential fuse circuit of claim 2, wherein said second transistor is an NMOS transistor and said first transistor is a PMOS transistor.

4. The low current differential fuse circuit of claim 1, further comprising an inverter circuit wherein said inverter circuit is coupled to said.

5. The low current differential fuse circuit of claim 1, wherein each of said first and second circuits comprise a transistor.

6. The low current differential fuse circuit of claim 1, wherein each of said first and second fuses comprise a metal fuse.

7. The low current differential fuse circuit of claim 1, wherein each of said first and second fuses comprise a polysilicon fuse.

8. The low current differential fuse circuit of claim 1, wherein said supply potential is in the range of 4.5 to 7.0 volts.

9. A fuse circuit for calibrating output characteristics of an integrated circuit, said fuse circuit comprising an output $V_f$ and a plurality of low current differential fuse circuits, each of said plurality of low current differential fuse circuits comprising:
- a first fuse, having a first resistance, coupled to receive a supply potential;
- a first circuit coupled to said first fuse for blowing said first fuse;
- a first transistor, having its source connected to said first fuse and to said first circuit and its gate configured to receive a bias potential;
- a second fuse, having a second resistance coupled to receive a reference potential;
- a second circuit coupled to said second fuse for blowing said second fuse; and
- a second transistor, having its source connected to said second fuse and to said second circuit and its gate configured to receive said bias potential;
- wherein when said first fuse is fully or partially blown, said first resistance is higher than said second resistance, wherein when said second fuse is fully or partially blown, said second resistance is higher than said first resistance, and
- wherein said output $V_f$ being relatively low when said first resistance is higher than said second resistance and being relatively high when said second resistance is higher than said first resistance, such that the state of said output being independent of said bias potential.

10. The fuse circuit of claim 9, wherein each of said plurality of low current differential fuse circuits further comprise a bias circuit for generating said bias potential potential, wherein said bias circuit is coupled to said first and second transistors.

11. The fuse circuit of claim 10, wherein said second transistor an NMOS transistor and said first a PMOS transistor.

12. The fuse circuit of claim 9, wherein each of said plurality of low current differential fuse circuits further comprise an inverter circuit wherein said inverter circuit is coupled to said output $V_f$.

13. The fuse circuit of claim 9, wherein each of said first and second circuits of said plurality of low current differential fuse circuits comprise a transistor.

14. The fuse circuit of claim 9, wherein each of said first and second fuses of said plurality of low current differential fuse circuits comprise a metal fuse.

15. The fuse circuit of claim 9, wherein each of said first and second fuses of said plurality of low current differential fuse circuits comprise a polysilicon fuse.

16. The fuse circuit of claim 9, wherein said supply potential is in the range of 4.5 to 7.0 volts.

17. The fuse circuit of claim 9, further comprising a component that is shared by each of said second circuits of said plurality of low current differential fuse circuits.

18. A method of forming a low current differential fuse circuit having an output $V_f$, comprising the steps of:
- providing a first fuse, having a first resistance, coupled to a supply potential;
- providing a second fuse, having a second resistance, coupled to a reference potential;
- providing a first circuit for blowing said first fuse;
- providing a second circuit for blowing said second fuse;
- providing a first transistor, having its source connected to said first fuse and to said first circuit and its gate configured to receive a bias potential;
- providing a second transistor, having its source connected to said second fuse and to said second circuit and its gate configured to receive said bias potential; and
- blowing one of said first and second fuses,
- wherein when said first fuse is fully or partially blown, said first resistance is higher than said second resistance, wherein when said second fuse is fully or partially blown said second resistance is higher than said first resistance, and
- wherein said output $V_f$ being relatively low when said first resistance is higher than said second resistance and being relatively high when said second resistance is higher than said first resistance, such that the state of said output being independent of said bias potential.

19. The method of claim 18, further comprising the step of providing a bias circuit for biasing said first and second transistors.

20. The method of claim 18, further comprising the step of providing an inverter circuit for inverting the output of said output $V_f$.

21. The method of claim 20, wherein said second transistor is an NMOS transistor and said first transistor is a PMOS transistor.

22. The method of claim 18, wherein said step of blowing one of said first and second fuses comprises providing a high current path through one of said first and second circuits.

* * * * *